United States Patent [19]

Hanisko

[11] 4,316,155
[45] Feb. 16, 1982

[54] VOLTAGE CONTROLLED OSCILLATOR HAVING RATIOMETRIC AND TEMPERATURE COMPENSATION

[75] Inventor: John C. P. Hanisko, Southfield, Mich.

[73] Assignee: The Bendix Corporation, Southfield, Mich.

[21] Appl. No.: 72,799

[22] Filed: Sep. 5, 1979

[51] Int. Cl.³ ............................................. H03L 7/00
[52] U.S. Cl. ...................................... 331/18; 331/82; 307/261
[58] Field of Search ............... 328/127, 128, 181, 185; 307/288, 271, 261, 262; 331/111, 18, 182, 183

[56] References Cited

U.S. PATENT DOCUMENTS 3,339,088  8/1967  Dillard ................................ 328/128
3,482,116 12/1969  James ................................. 307/261
3,594,649  7/1971  Rauch ................................. 307/271
4,124,821 11/1978  Petr ................................... 328/128

Primary Examiner—David K. Moore
Attorney, Agent, or Firm—William A. Marvin; Russel C. Wells

[57] ABSTRACT

A voltage controlled oscillator for the conversion of a ratiometric analog signal into a digital signal is disclosed. The oscillator generates a square wave whose frequency is a function of the magnitude of the analog signal input. The variable frequency wave is generated by a comparator receiving high and low threshold levels from a network for comparison with a ramping voltage developed by a timing element. An increasing ramp is provided by a current source whose output is proportional to the analog signal and a decreasing ramp rate is provided by a current sink whose output is similarly proportional to the analog input signal. Because the analog input signal is ratiometric with variations in the power supply voltage, the ramp rates change with these variations, however the high and low threshold levels also change with variations in the supply voltage thereby the comparator generates a square wave output at a frequency independent of these variations. Temperature compensation is provided for the voltage controlled oscillator by matching the temperature coefficient of one of the gain elements in the current source to the temperature coefficient of the timing element. Further temperature compensation is implemented by equalizing the temperature coefficients of the four resistances forming the high and low threshold level network.

8 Claims, 5 Drawing Figures

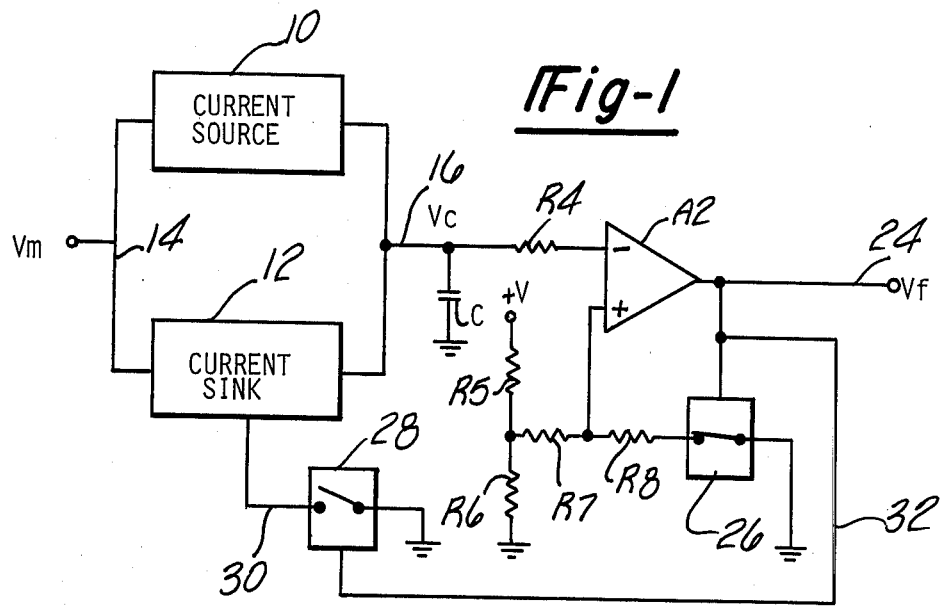
Fig-1
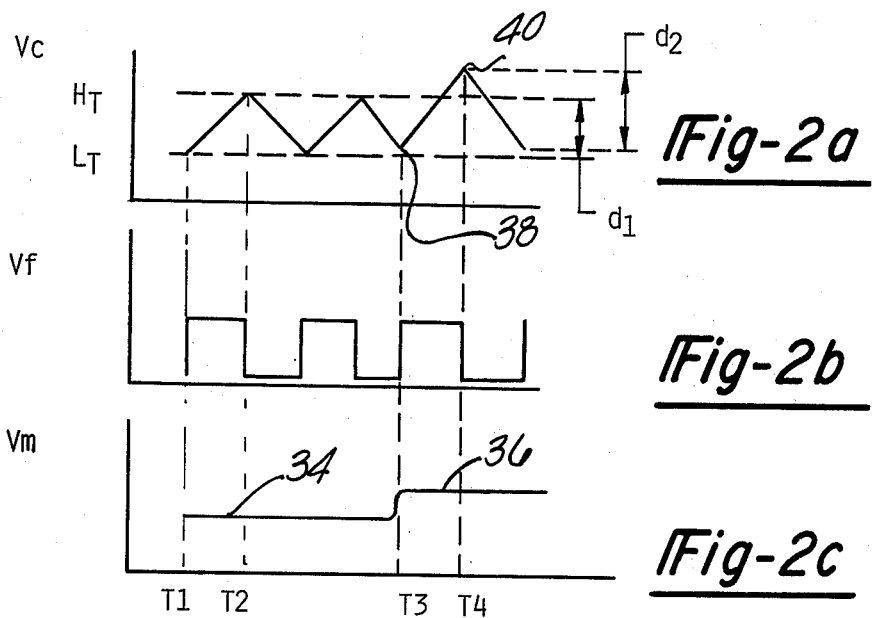
Fig-2a
Fig-2b
Fig-2c

VOLTAGE CONTROLLED OSCILLATOR HAVING RATIOMETRIC AND TEMPERATURE COMPENSATION

BACKGROUND OF THE INVENTION

The invention pertains generally to the art of converting an analog signal into a digital form and is more specifically directed to a voltage control oscillator having ratiometric and temperature compensation.

The consequences of environmental regulations and the world's dwindling fuel supply have necessitated the precision control of air/fuel ratio for internal combustion engines. In response to this need there have been developed electronic fuel injection systems which accurately control the fuel metering requirements of an internal combustion engine based on the instantaneous operating parameters thereof. With recent advances in digital electronics in general and particularly with the advent of small fast microprocessor units prevalent forms of electronic control units will in the future be digital in operation.

Conventionally, microprocessors are adapted to receive digital inputs in the form of binary words or binary logic signals. Because of the inherently analog nature of the engine operating environment and its parameter sensors, an analog-to-digital converter is necessary for transforming this information to a microprocessor in a readable form.

A convenient way of accomplishing analog-to-digital conversion with a microprocessor utilizes a voltage controlled oscillator which generates a square wave whose frequency is representative of the magnitude of the analog input parameter. Advantageously, the switching levels of the square wave can be read directly by the microprocessor as a form of serial logic signal requiring only one input bit. By timing the duration between transitions in the square wave with a counter, the microprocessor can internally convert the elapsed time into a digital word which can be processed further.

One significant problem with the analog-to-digital conversion of the operating parameters of an internal combustion engine is the dependence on the analog signals with supply voltage variations. The supply or battery voltage in an internal combustion engine system is relatively unregulated because of changing speed and load conditions. Starting conditions and/or air conditioning loads can produce substantial changes in the voltage supply and hence the analog output from the sensors sampling the instantaneous operating parameters of the engine. Therefore it would be highly desirable for any conversion technique to be provided with compensation for variations in supply voltage.

Further the engine compartment of an internal combustion engine is a very hostile environment for electronics. Many components and electronic systems are temperature dependent and the range over which these components must operate is extensive. Therefore it would be highly desirable for any compensation technique to further include compensation for temperature variations.

SUMMARY OF THE INVENTION

Accordingly, it is a primary object of the invention to provide an analog-to-digital conversion technique which is independent of variations in supply voltage for use with an internal combustion engine.

Further, it is an object of the invention to provide an analog to digital conversion technique which includes compensation for variations in temperature.

Still further, it is an object of the invention to provide the analog-to-digital conversion with a voltage controlled oscillator whose frequency is independent of variations in supply voltage and is temperature compensated.

Moreover, it is another object of the invention to provide the frequency of the voltage controlled oscillator independent of variations in supply voltage by utilizing ratiometric conversion techniques.

To accomplish the aforementioned objects, the invention provides a voltage controlled oscillator circuit including a means for comparing a voltage developed on a timing element with a low and high threshold voltage. The voltage developed on the timing element is ramped upwardly until it exceeds the high threshold voltage and then ramped downwardly until it is less than the lower threshold voltage by a ramp signal generating means. The comparator means switches to different output levels as the thresholds voltages are exceeded thereby generating a square wave at a frequency dependent upon the switching period. Further included are means for controlling the ramp rates of the timing element proportionally to the magnitude of an analog input signal. Normally, the analog input signal is representative of a parameter to be converted and is ratiometric with variations in the voltage supply and therefore the ramp rates change depending upon the magnitude of the operating parameter and voltage supply variations.

However, the invention provides means for generating the high and low threshold voltages as a function of variations in supply voltage. Thus, the supply voltage variations will operate to raise or lower the threshold voltages while increasing or decreasing the ramp rates also. By conforming the changes in the ramp rates to the changes in the threshold voltages a frequency independent of supply voltage variations can be obtained. With this error eliminated, the square wave output frequency will be proportional only to variations in the input parameter.

In a preferred embodiment, the timing element comprises a capacitor and the ramp rates are generated by the controlled charging and discharging of this element with current. The increasing ramp for the capacitor is generated by charging it with a voltage control current source and the decreasing ramp is provided by discharging the capacitor with a voltage control current sink. The source and sink rate are controlled by the analog input voltage which is a function of the input parameter and ratiometric with the voltage supply. The current source is on all of the time, and charges the capacitor at a rate determined by a gain element controlling the current gain of the device. The current sink which has a sink rate twice as fast as the source rate is enabled by a first switch means responsive to one of the output levels of the comparator means.

Preferably, the high and low threshold voltages for the comparator means are developed by a resistive network dividing down the supply voltage. The different threshold voltages are generated by switching two different amounts of resistance into the network. The two values are switched in the network by a second switch means responsive to one of the output levels of the comparator means.

Advantageously, the voltage controlled oscillator circuit can be temperature compensated by matching the temperature coefficients of the opposing resistances in the threshold network. By additionally providing the gain element of the current source with a negative equivalent of temperature coefficient displayed by the timing element, the invention eliminates the temperature dependence of the output frequency of the comparator means.

These and other objects and features and aspects of the invention will be more fully described and better understood if a reading of the following detailed description is undertaken in conjunction with the appended drawings wherein:

BRIEF DESCRIPTION OF THE DRAWINGS

FIG. 1 is a partially block and partially schematic electrical circuit diagram of a voltage controlled oscillator performing an analog-to-digital conversion in accordance with the invention;

FIGS. 2a–c are waveform diagrams of various signals at particular locations of the system illustrated in FIG. 1.

DETAILED DESCRIPTION OF THE PREFERRED EMBODIMENT

Figure 3:
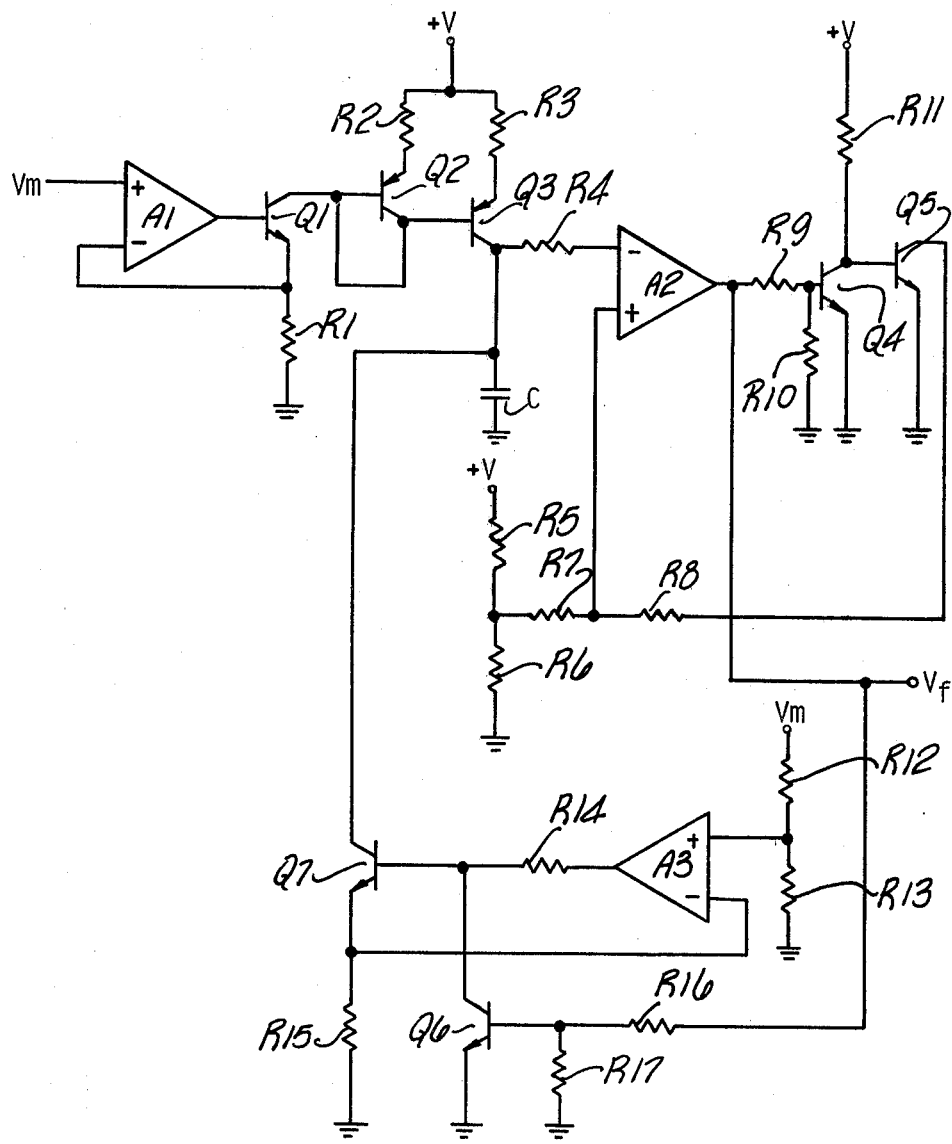
FIG. 3 is a detailed circuit schematic of the voltage controlled oscillator illustrated in FIG. 1.

In FIG. 1 there is shown a voltage controlled oscillator (VCO) constructed in accordance with the invention. The voltage controlled oscillator receives a analog input voltage $V_m$ at lead line 14 and transforms it into a square wave output signal $V_f$ whose frequency is dependent upon the magnitude of the input. The input voltage $V_m$ is ratiometric with voltage variations in a supply $+V$ and further has a magnitude component representative of the changes in an operating parameter of the engine. The operating parameter that is represented can conventionally be any one of the following: the absolute pressure of the intake manifold, the speed of revolution of the engine, the ambient air temperature, or the temperature of the engine coolant, etc. Analog transducers capable of generating such ratiometric input signals and their connections to an internal combustion engine are readily known in the art and will not be further discussed.

The VCO comprises a comparator amplifier A2 which receives at its inverting input a voltage through resistor R4 from a timing element illustrated as capacitor C. The comparator compares this voltage to a threshold voltage supplied to its noninverting input that is developed by a resistive network comprising resistors R5, R6, R7 and R8. A high threshold voltage, $H_t$, is generated from the network by connecting the noninverting input of the amplifier A2 to the junction of the resistors R5 and R6 through a resistor R7. The voltage division is accomplished by coupling the serial combination of resistors R5 and R6 between the supply voltage $+V$ and ground. The high threshold therefore is given by the equation $H_t = +V(R6/R5+R6)$ and varies directly with supply voltage variations.

The low voltage threshold $L_t$ is supplied by connecting one terminal of the resistor R8 to the noninverting input of the amplifier A2 and coupling the other terminal to ground through the normally open contacts of an analog switch 26. The switch 26 is closed by a high level output from the comparator amplifier A2. Only when the switch 26 is closed does the amplifier A2 have the low threshold applied. At other times the high threshold is generated by the resistive network. The low voltage threshold is given by the equation $L_t = +V(R6)(R8)/(R5+R6)(R7+R8)$ and varies directly with the supply voltage variations. It is seen that the low threshold $L_t$ and the high threshold $H_t$ both vary directly with supply voltage variations but the difference between the thresholds varies ratiometrically. If the supply voltage increases then the difference will ratiometrically increase and similarly a supply voltage decrease will ratiometrically decrease the difference between the thresholds.

The capacitor voltage ramps upwardly at a rate dependent upon the amount of current supplied from a current source-10 via line 16. The source is dependent upon the analog input parameter signal $V_m$ and increases with increasing magnitude of $V_m$ and likewise decreases with the lowering of $V_m$. In parallel with the current source 10 is a current sink 12 which discharges the capacitor at a controlled rate dependent upon the analog input parameter $V_m$. The current sink 12 is enabled by ungrounding line 30. The line 30 is connected to the ground through the contacts of switch 28 which open in response to a low level output from comparator A2.

During the circuit operation the variable frequency square wave $V_f$ is generated by comparator A2 switching between a high and a low level in response to the voltage on the capacitor C exceeding the high threshold and dropping below the low threshold respectively. With reference now to FIGS. 2a–2c it is seen that for an analog input voltage $V_m$ of a level 34, at $T_1$ the voltage on the capacitor will ramp increasingly upward at a rate dependent upon $V_m$. Because the high threshold $H_t$ at this time is greater than the capacitor voltage the comparator A2 will output a high level for the waveform $V_f$. When the increasing voltage on the capacitor C exceeds the high threshold $H_t$ at time $T_2$ the comparator will switch to a low state. The low transition of the comparator closes switch 26 and grounds the resistor R8 through the switch 26. Simultaneously, the low transition ungrounds the terminal line 30 by opening switch 28. The low threshold $L_T$ is then presented to the noninverting input of the comparator A2 and the current sink 12 begins to discharge the capacitor with a ramp rate proportional to $V_m$. The current drawn from the capacitor C is twice that supplied as the charging rate to provide an equivalent down ramp to the up ramp already generated. This accounts for the fact that the current source is continually in operation and only the current sink is switched. When the downwardly ramping voltage drops below the low threshold $L_t$ the comparator transitions to a high level. This operation produces the square wave $V_f$ which has a 50% duty cycle because of the equivalent charging and discharging rates of the capacitor 18, assuming a constant $V_m$ value.

If due to supply voltage variations, $V_m$ increases to a level 36, the low threshold will be increased to point 28 and the high threshold raised to point 40 by the resistive network. This action will increase the difference between the thresholds to $d_2$ from $d_1$ to cancel the effects of the supply voltage variations on the oscillator. Thus, when the increase in $V_m$ due to supply voltage variation increases the ramp rates, the frequency of the output $V_f$ will remain constant as is illustrated where the time T1–T2 is equal to T3–T4. However, if the input parameter voltage $V_m$ changes because of the physical parameter changing then the thresholds will remain the same and the frequency of the output $V_f$ will change accordingly therewith. It has been shown that the circuit produces a square wave output frequency proportional to an input parameter whose output waveform $V_f$ is independent of variations in the voltage supply $+V$.

The detailed circuitry comprising the current source 10, the current sink 12, and the switches 26 and 28 are better illustrated in FIG. 3. The detailed connection and operation to the comparator A2, timing element C and resistive network R5, R6, R7 and R8 have been previously described.

The current source 10 comprises a voltage follower and a current mirror. The voltage follower includes amplifier A1 whose output is connected to the base of a controlled NPN transistor Q1. The emitter of the transistor Q1 is coupled to ground through resistor R1 and also to the inverting input of the amplifier A1. Resistor R1 is a gain element which determines the slope of the change in current for a corresponding change in current. The amplifier A1 receives the analog signal input $V_m$ at its noninverting input.

The collector of Q1 is connected to the bases of two mirror transistors Q2 and Q3. Each of the emitters of the mirror transistors Q2, Q3 are coupled to the supply voltage $+V$ through resistors R2 and R3 respectively. The collector of Q2 is coupled back to the collector of Q1 while the collector of Q3 is coupled to the input terminal of the capacitor C. The voltage $V_m$ will control the amplifier A1 to change the conductance in the transistor Q1 to pull a set amount of current through the first member of the mirror transistor Q2. This controlled amount of current will be mimicked in the second part of the mirror, transistor Q3. Thus, a controlled amount of current proportional to the voltage $V_m$ will be supplied to the capacitor and cause differing ramp rates based upon the operating parameter and variations in the supply voltage.

The current sink 12 is also comprised of a voltage follower including amplifier A3 which controls the conductance of a sink transistor Q7 by its connection through a resistor R14 to the transistor base. The sink transistor Q7 pulls current away from the capacitor C at the coupling of its collector to the input terminal of the capacitor C. The amount of current drawn from the capacitor C is regulated by the voltage developed across the resistor R15 coupled between the emiter of the transistor Q7 and ground which is fed back to the inverting input of the amplifier A3. The voltage on resistor R15 is controlled by the amplifier A3 to be equivalent to that received at its noninverting input. The voltage is generated from the junction of a voltage divider comprising resistors R12 and R13. The resistors R12 and R13 are connected between the input parameter signal $V_m$ and ground. By choosing the resistances of the divider combination and the resistor R15 the amount of current drawn from the capacitor can be designed to be proportional to $V_m$ and twice that delivered by the source 10. In this manner equivalent charging and discharging ramps will be generated by the source and sink and the ramp rates will be dependent upon the input parameter $V_m$ only.

The switch 26 comprises NPN transistors Q4 and Q5. The base of Q4 is connected to the junction of a pair of divider resistors R9 and R10 connected between the output of amplifier A2 and ground. The collector of transistor Q4 is connected to the supply voltage $+V$ through resistor R11 and its emitter is grounded. Q4 is therefore connected as an inverter to provide a high level output signal when the output of the comparator amplifier A2 is low. Q5 is connected by its collector to one terminal of the resistor R8 and to ground by its emitter terminal. The conductance of Q5 is controlled by coupling its base to the collector of Q4. When a high level signal from the amplifier A2 turns transistor Q4 on, Q5 will be turned off. Conversely when the amplifier A2 transitions to a low level turning Q4 off, Q5 will be biased on through the resistor R11 to ground the resistor R8 through its collector-to-emitter junction and supply the low threshold voltage $L_T$.

Switch 28 is comprised of a transistor Q6 whose base is connected to the junction of a pair of divider resistors R16 and R17 coupled between the output of the amplifier A2 and ground. The collector of Q6 is connected to the base of transistor Q7 and its emitter is connected to ground. A high level output from the amplifier A2 will turn the transistor Q6 on, thereby disabling the base of Q7 and turning the current sink off. When the amplifier A2 transitions to a low level Q6 will be turned off enabling the current sink by lifting the ground from the base of Q7.

The temperature compensation of the aforementioned circuitry will now be more fully discussed. If the component values and transistor operating points in the above described circuit are judiciously selected it can be shown that the frequency of operation is given by the equation:

$$f = [(R5+R6)(R7+R8)V_m]/[2(R1)(R6)(R7)(C)(+V)].$$

It is seen that if the temperature coefficient of R5 is equal to that of R6, if the temperature coefficient of R7 is equal to that of R8, and if the temperature coefficient of R1 is selected such that it is the exact negative of C, then the frequency will be independent of temperature. To maintain this simplified expression for f it is necessary for resistors R2 and R3 to track each other, R12 and R13 to track each other, and R1 and R15 to track each other. Tracking means that these resistance values will change proportionally with temperature so that their ratios will remain unchanged. Since the threshold network resistors are already picked to be precision values they can also be picked for temperature coefficient values without adding greatly to their cost. It is seen that a facile method has been developed for temperature compensation of the voltage controlled oscillator circuit.

While a preferred embodiment of the present invention has been shown and described it will be obvious to those skilled in the art that it should not be so limited because the disclosure will be susceptible to various changes and modifications without departing from the spirit and scope of the invention as presented in the appended claims.

What is claimed is:

1. A voltage controlled oscillator circuit for generating first and second level output signals dependent upon the magnitude of an input parameter signal and independent of supply voltage and temperature variations, said circuit comprising:

means adapted to receive a supply voltage of a single polarity;

timing means;

a voltage controlled current source responsive to the input parameter signal for charging said timing means at a rate proportional to the magnitude of the input parameter signal and ratiometrically with variations in said supply voltage for generating an increasing ramp of a sawtooth signal;

a voltage controlled current sink having substantially twice the current capacity of said current source and responsive to the input parameter signal and the second level output signal for controlling the discharging of said timing means at a rate proportional to the magnitude of the input parameter signal and ratiometrically with variations in said supply voltage for generating a decreasing ramp of a sawtooth signal;

threshold signal generating means responsive to the first level output signal for generating a first value threshold signal ratiometrically with variations in said supply voltage and including switch means responsive to the second level output signal for generating a second value threshold signal ratiometrically with variations in said supply voltage; and a single comparator means having said timing means electrically connected to one input and said threshold signal generating means electrically connected to another input and operative in response thereto for generating a first and second level magnitude output signal at a frequency independently of said supply voltage and dependent upon the magnitude of the input parameter signal.

2. A voltage controlled oscillator circuit as defined in claim 1 wherein said timing means is a capacitor.

3. A voltage controlled oscillator circuit as defined in claim 1 or 2 wherein:

the rate of charging and discharging said timing means is equivalent whenever the input parameter signal is constant.

4. A voltage controlled oscillator circuit as defined in claim 1 or 2 wherein:

said threshold signal generating means includes a resistive network having a first resistor and a second resistor serially connected between said supply voltage and a reference potential, said network further including a third resistor and a fourth resistor serially connected between the junction of said first and second resistors and a one terminal of a switch means which has its other terminal coupled to said reference potential, wherein the junction of said third and fourth resistors is connected to said comparator means and wherein said switch is responsive to said second level output signal and operable to electrically connect said fourth resistor to said reference potential to generate said second value threshold signal.

5. A voltage controlled oscillator circuit as defined in claim 4 wherein:

said first and second resistors have equivalent temperature coefficients and said third and fourth resistors have equivalent temperature coefficients.

6. A voltage controlled circuit as defined in claim 1 or 2 wherein said voltage controlled current source includes:

a voltage follower having a gain element developing a feedback voltage proportional to the amount of current flowing therethrough and means responsive to the input parameter signal for controlling the current through said element such that said feedback voltage is equivalent to the input parameter signal voltage; and a current mirror coupled to said voltage follower for providing a source of current to charge said timing means which is proportional to the current flowing through said gain element.

7. A voltage controlled oscillator circuit as defined in claim 6 wherein:

the temperature coefficient of said gain element is the negative equivalent of the temperature coefficient of said capacitor.

8. A voltage controlled oscillator circuit as defined in claim 1 or 2 wherein:

said current source is operable to deliver current at a source rate to said timing means during generation of said increasing and decreasing ramps of said sawtooth signal; and said current sink is operable in response to said second level output signal, to draw current from said capacitor during generation of said decreasing ramp of said sawtooth signal, said current sink having a sink rate of twice said source rate whereby said increasing and decreasing ramp rates of said sawtooth signal will be equivalent for a constant input parameter voltage.

* * * * *